(12) United States Patent
Gong et al.

(10) Patent No.: US 10,833,070 B2
(45) Date of Patent: Nov. 10, 2020

(54) FAN-OUT SEMICONDUCTOR PACKAGE MODULE

(71) Applicant: SAMSUNG ELECTRONICS CO., LTD., Suwon-si (KR)

(72) Inventors: Jung Chul Gong, Suwon-si (KR); Yong Ho Baek, Suwon-si (KR); Young Sik Hur, Suwon-si (KR); Joo Hwan Jung, Suwon-si (KR); Yoo Rim Cha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/107,302

(22) Filed: Aug. 21, 2018

(65) Prior Publication Data
US 2019/0273079 A1 Sep. 5, 2019

(30) Foreign Application Priority Data
Mar. 5, 2018 (KR) .................. 10-2018-0025833

(51) Int. Cl.
*H01L 27/07* (2006.01)
*H01L 23/00* (2006.01)
(Continued)

(52) U.S. Cl.
CPC ......... *H01L 27/0727* (2013.01); *H01L 21/56* (2013.01); *H01L 23/3157* (2013.01);
(Continued)

(58) Field of Classification Search
CPC combination set(s) only.
See application file for complete search history.

(56) References Cited

U.S. PATENT DOCUMENTS

| 2005/0255303 A1 | 11/2005 | Sawatari et al. |
| 2016/0190108 A1* | 6/2016 | Lee .................. H01L 23/13 |
| | | 257/692 |

(Continued)

FOREIGN PATENT DOCUMENTS

| JP | 2005-311249 A | 11/2005 |
| JP | 2009-054930 A | 3/2009 |

(Continued)

OTHER PUBLICATIONS

Communication dated Jun. 27, 2019 issued by the Korean Intellectual Property Office in counterpart Korean Application No. 10-2018-0025833.

(Continued)

*Primary Examiner* — Ratisha Mehta
(74) *Attorney, Agent, or Firm* — Sughrue Mion, PLLC

(57) ABSTRACT

A fan-out semiconductor package module that is easily manufactured includes a first connection member including a wiring layer, a first passive component mounted on the first connection member, a first encapsulation portion encapsulating at least a portion of the first connection member and the first passive component, a semiconductor chip having an active surface with a connection pad disposed thereon and an inactive surface opposing the active surface and disposed in a first through-hole penetrating through the first connection member and the first encapsulation portion, a second encapsulation portion covering at least a portion of the semiconductor chip and encapsulating at least a portion of the first encapsulation portion and the first connection member, and a second connection member disposed on the first connection member and the active surface of the semiconductor chip and including a redistribution layer electrically connected to the connection pad and the first passive component.

19 Claims, 16 Drawing Sheets

(51) Int. Cl.
*H01L 23/522* (2006.01)
*H01L 23/31* (2006.01)
*H01L 21/56* (2006.01)

(52) U.S. Cl.
CPC .......... *H01L 23/5226* (2013.01); *H01L 24/09* (2013.01); *H01L 24/13* (2013.01); *H01L 24/33* (2013.01); *H01L 24/49* (2013.01); *H01L 2224/02372* (2013.01); *H01L 2224/02377* (2013.01); *H01L 2224/02379* (2013.01); *H01L 2224/0401* (2013.01)

(56) References Cited

U.S. PATENT DOCUMENTS

| | | |
|---|---|---|
| 2016/0336249 A1 | 11/2016 | Kang et al. |
| 2017/0077072 A1 | 3/2017 | Yap |
| 2017/0287825 A1 | 10/2017 | Lee et al. |
| 2019/0013300 A1 | 1/2019 | Baek et al. |
| 2019/0131285 A1 | 5/2019 | Kim et al. |

FOREIGN PATENT DOCUMENTS

| | | |
|---|---|---|
| KR | 10-2016-0083388 A | 7/2016 |
| KR | 10-2017-0112363 A | 10/2017 |
| KR | 10-1933421 B1 | 12/2018 |
| KR | 10-2019-0005697 A | 1/2019 |
| TW | 201635480 A | 10/2016 |
| TW | 201715664 A | 5/2017 |
| TW | 201739031 A | 11/2017 |

OTHER PUBLICATIONS

Communication dated Apr. 8, 2019 issued by the Taiwan Intellectual Property Office in counterpart Taiwan Application No. 107128355.

* cited by examiner

FAN-OUT SEMICONDUCTOR PACKAGE MODULE

CROSS-REFERENCE TO RELATED APPLICATION(S)

This application claims benefit of priority to Korean Patent Application No. 10-2018-0025833 filed on Mar. 5, 2018 in the Korean Intellectual Property Office, the disclosure of which is incorporated herein by reference in its entirety.

TECHNICAL FIELD

The present disclosure relates to a semiconductor package module modularized by mounting a semiconductor chip, along with a plurality of passive components, in a single package.

BACKGROUND

Along with development of large-size portable displays, there has been increasing demand to increase battery capacity. As battery capacity is increased, an area occupied by a battery is increased and, thus, to this end, there is a need to reduce a size of a printed circuit board (PCB) to reduce a mounting area of a component and, accordingly, modularization has continuously attracted attention.

A related art scheme of mounting a plurality of components may be, for example, chip onboard (COB) technology. COB is a method of mounting a separate passive device and semiconductor package on a printed circuit board using surface mounting technology (SMT). This method is advantageous in terms of cost, but, a minimum interval between components needs to be maintained and, thus, a wide mounting area is required and there is a problem in that electrical noise may be increased due to high electromagnetic interference (EMI) between components and a long distance between a semiconductor chip and a passive component.

SUMMARY

An aspect of the present disclosure may provide a fan-out semiconductor package module for minimizing a mounting area of a semiconductor chip and a plurality of passive components and minimizing an electrical path between the semiconductor chip and the passive components.

Another aspect of the present disclosure may provide a fan-out semiconductor package module for easily preventing a small-sized component from being detached or deviating from a mounting position during formation of an encapsulant.

According to the present disclosure, a plurality of passive components and a semiconductor chip may be mounted and modularized together in a single package and passive components may be arranged and encapsulated in different regions depending on size.

For example, according to an aspect of the present disclosure, a fan-out semiconductor package module includes a first connection member including a wiring layer, a first passive component mounted on the first connection member, a first encapsulation portion encapsulating at least a portion of the first connection member and the first passive component, a semiconductor chip having an active surface with a connection pad disposed thereon and an inactive surface opposing the active surface and disposed in a first through-hole penetrating through the first connection member and the first encapsulation portion, a second encapsulation portion covering at least a portion of the semiconductor chip and encapsulating at least a portion of the first encapsulation portion and the first connection member, and a second connection member disposed on the first connection member and the active surface of the semiconductor chip and including a redistribution layer electrically connected to the connection pad and the first passive component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
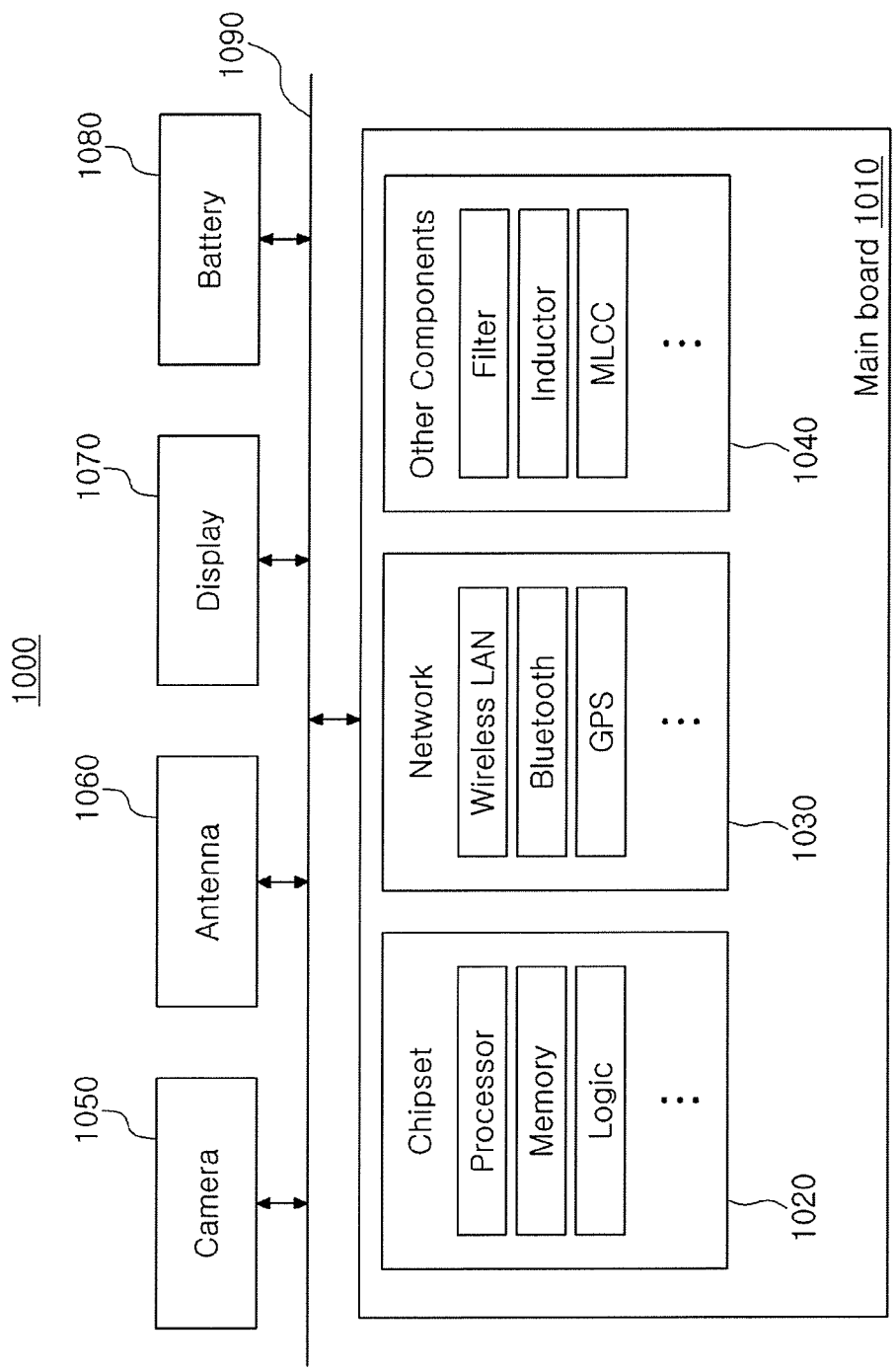
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.<0}

The electronic device 1000 may be a smartphone, a personal digital assistant (PDA) , a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
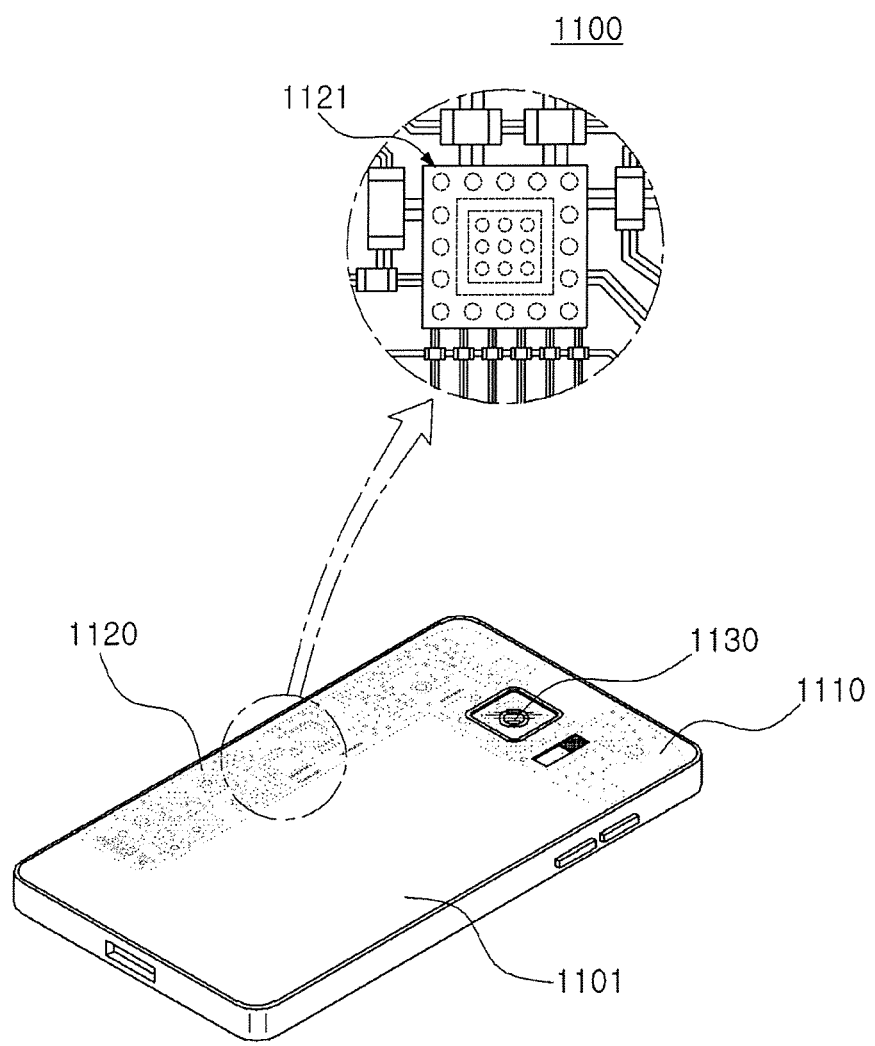
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1010 may be accommodated in a body 1101 of a smartphone 1100, and various electronic components 1120 may be physically or electrically connected to the main board 1010. In addition, other components that may or may not be physically or electrically connected to the mainboard 1010, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
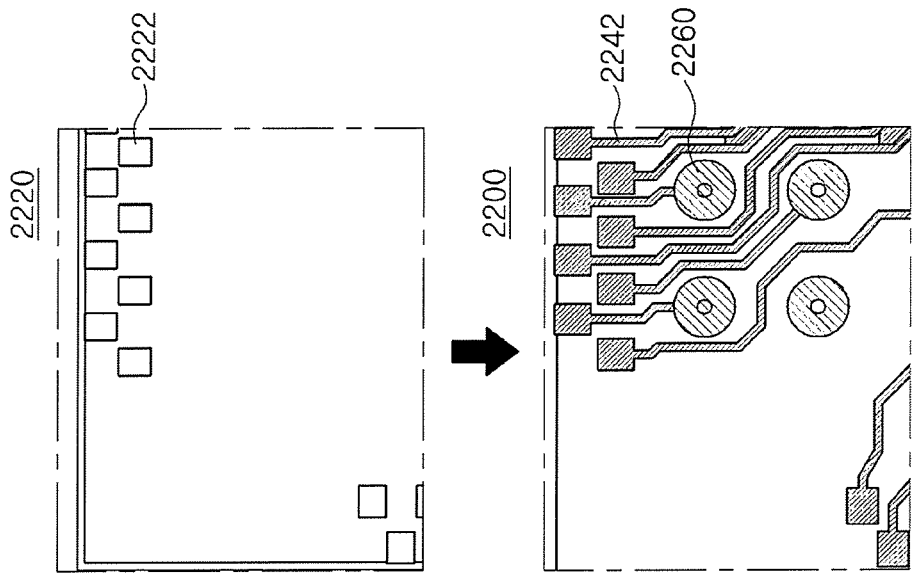
FIGS. 3A and 3B are schematic cross-sectional views illustrating states of a fan-in semiconductor package before and after being packaged.
Figure 3A:
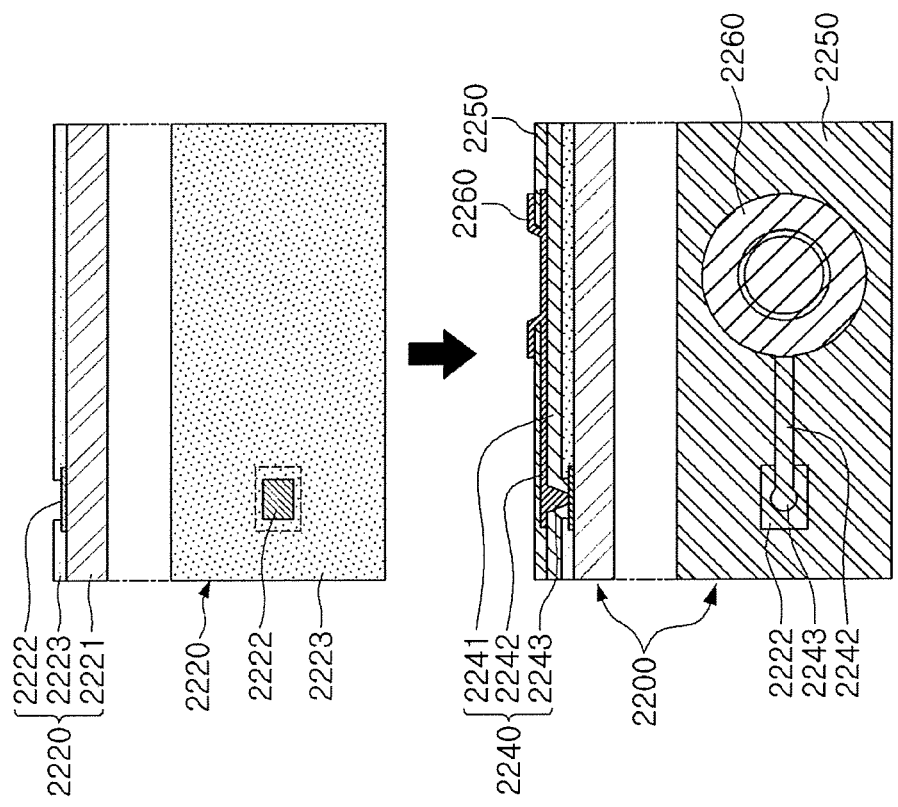

FIGS. 3A and 3B are schematic cross-sectional views illustrating states of a fan-in semiconductor package before and after being packaged.

Figure 4:
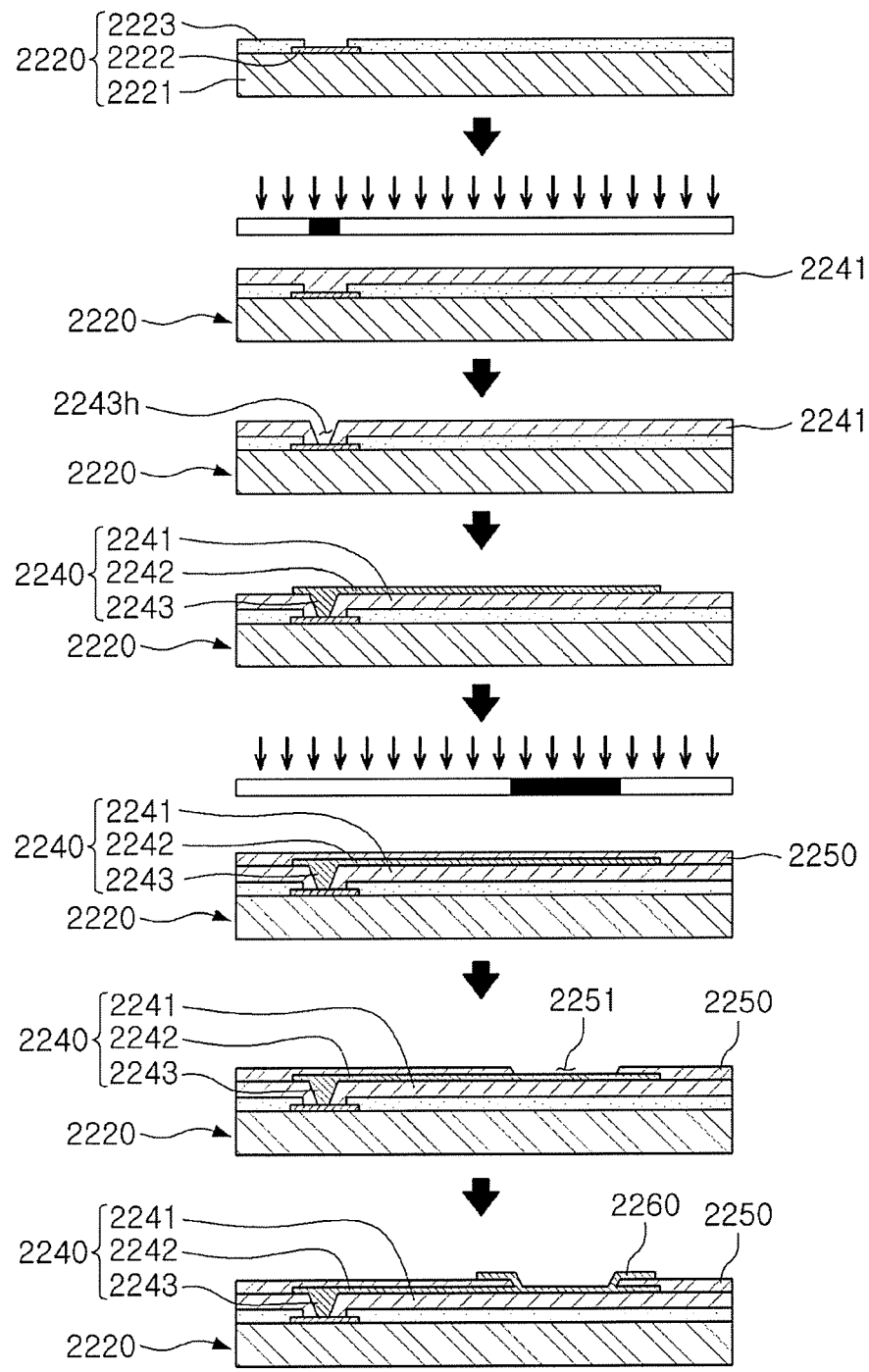
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least a portion of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
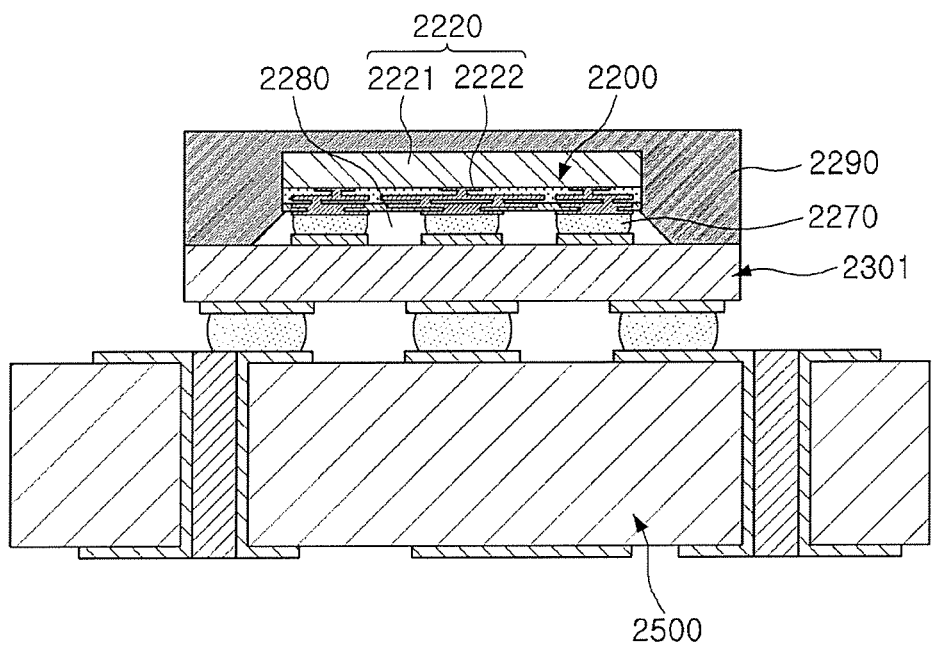
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board and is ultimately mounted on a mainboard of an electronic device.

Figure 6:
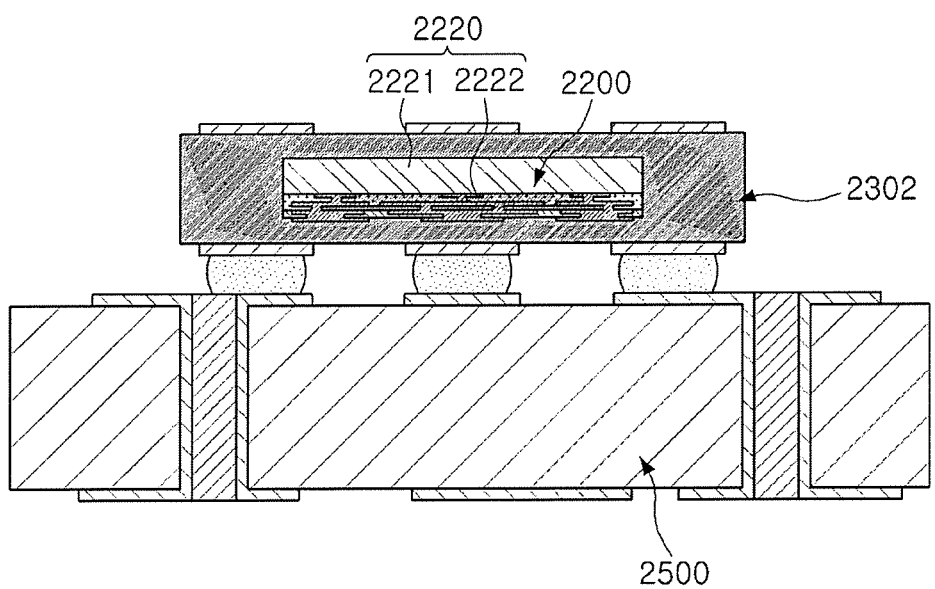
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-out Semiconductor Package

Figure 7:
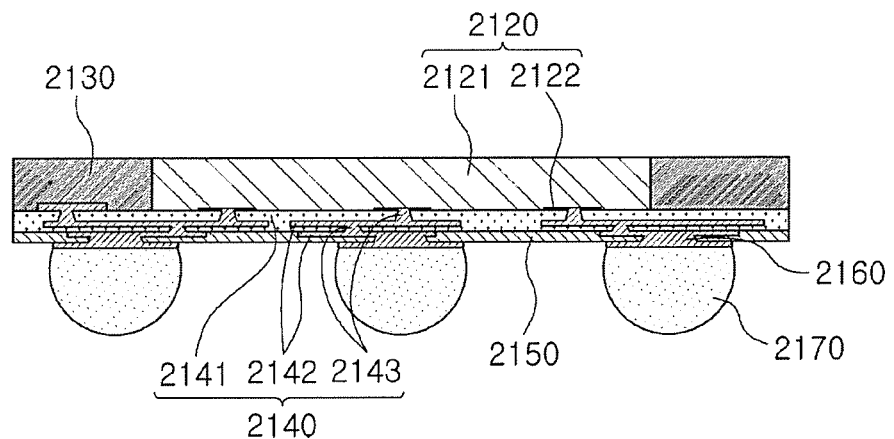
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer 123, and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
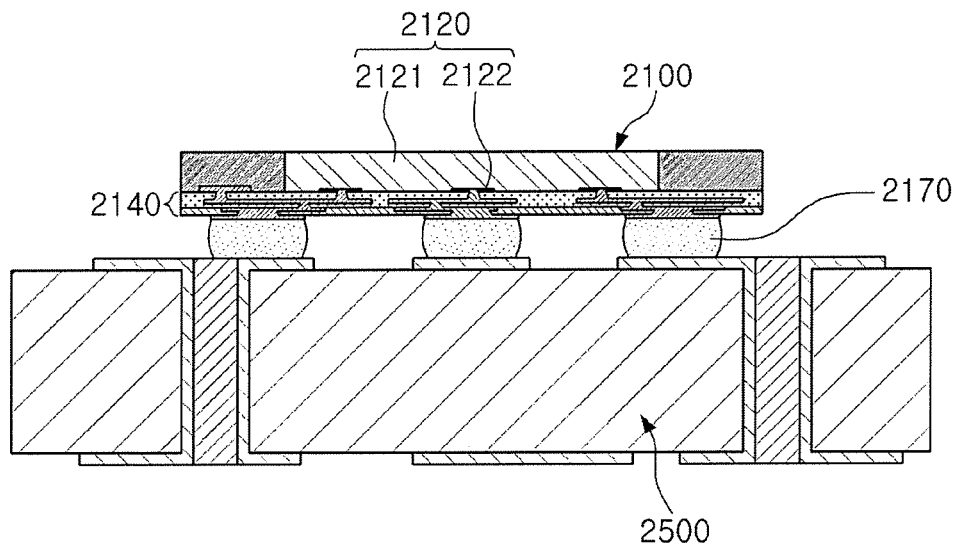
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a printed circuit board, or the like, having a scale, a purpose, and the like, different from those of the fan-out semiconductor package, and having the fan-in semiconductor package embedded therein.

Semiconductor Package Module

Figure 9:
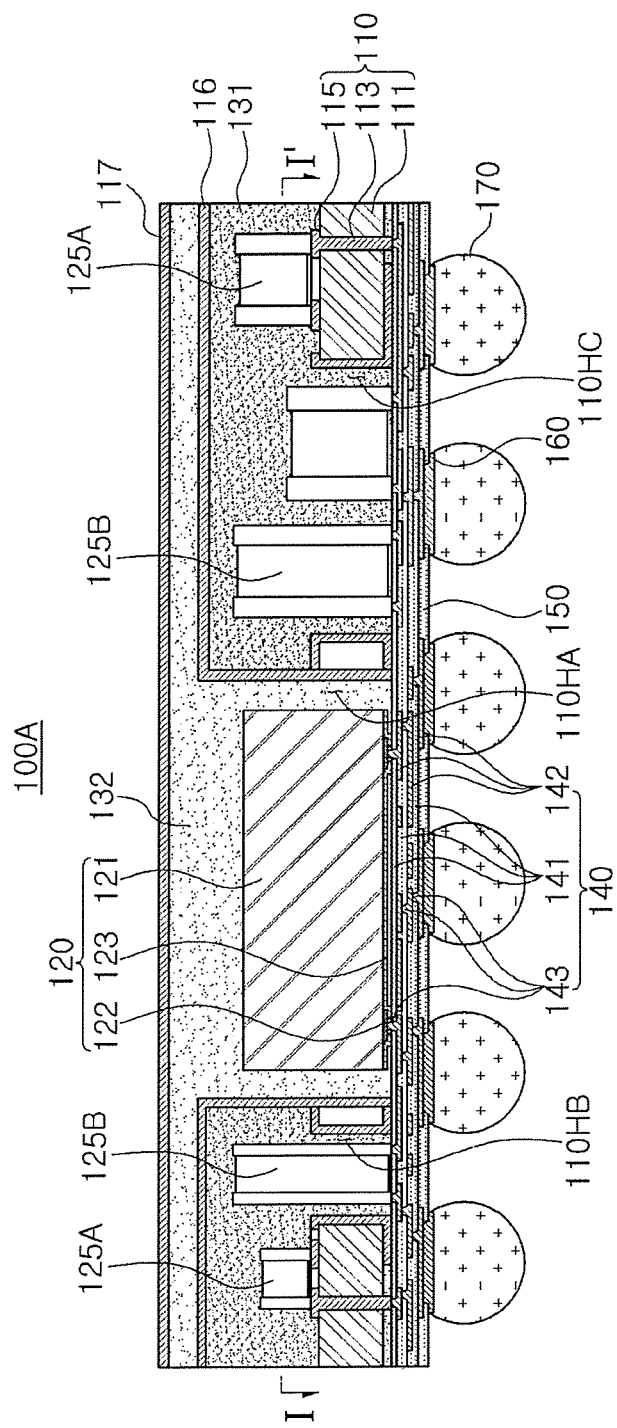
FIG. 9 is a schematic cross-sectional view of a fan-out semiconductor package module according to an embodiment.
Figure 10:
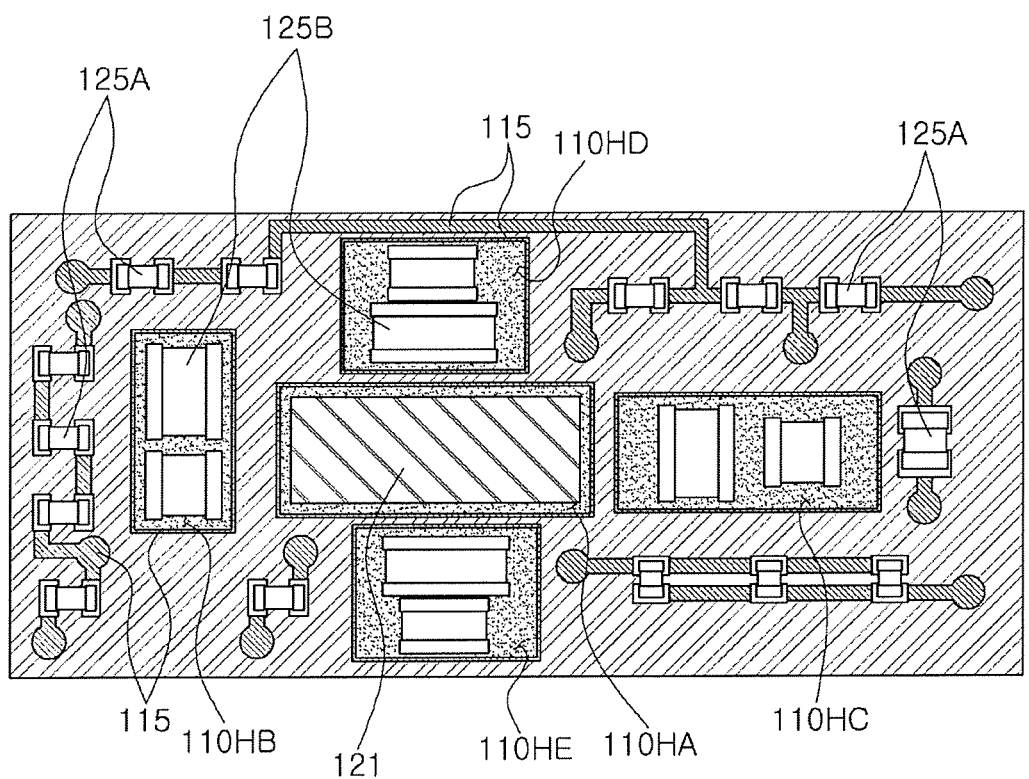
FIG. 10 is a cross-sectional view taken along a line I-I' of FIG. 9.

FIG. 9 is a schematic cross-sectional view of a fan-out semiconductor package module according to an embodiment. FIG. is a cross-sectional view taken along a line I-I' of FIG. 9.

Referring to the drawing, a fan-out semiconductor package module 100A according to the present embodiment may include a first connection member 110 having first to fifth through-holes 110HA, 110HB, 110HC, 110HD, and 110HE and a wiring layer, a semiconductor chip 120 disposed in the first through-hole 110HA and having an active surface with connection pads 122 disposed thereon and an inactive surface opposing the active surface, one or more first passive components 125A mounted on the first connection member 110, one or more second passive components 125B disposed in the second through-hole 110HB to the fifth through-hole 110HE, a first encapsulation portion 131 for covering at least a portion of the first connection member 110 and the first passive components 125A and encapsulating at least a portion of each of the second to fifth through-holes 110HB, 110HC, 110HD, and 110HE, a second encapsulation portion 132 for covering at least a portion of the semiconductor chip 120 and encapsulating the first connection member 110 and at least a portion of the first encapsulation portion 131, a second connection member 140 disposed on the first connection member 110 and the active surface of the semiconductor chip 120 and including a redistribution layer 142 electrically connected to the first and second passive components 125A and 125B, a passivation layer 150 disposed on the second connection member 140, an underbump metal layer 160 formed on an opening of the passivation layer 150 and electrically connected to the redistribution layer 142, and electrical connection structures 170 disposed on the underbump metal layer 160 and electrically connected to the redistribution layer 142 through the underbump metal layer 160.

Recently, along with development of large-sized mobile displays, there has been an increasing need for increase in battery capacity. Since an area occupied by a battery is increased due to increase in battery capacity, to this end, there is a need to reduce a size of a printed circuit board (PCB) to reduce a mounting area of a component and, accordingly, modularization has attracted continuous and increasing attention. An example of a related art for mounting a plurality of components may be a chip on board (COB) technology. The COB is a method of mounting a separate passive device and a semiconductor package on a printed circuit board using a surface mounting technology (SMT). This method is advantageous in terms of price, but a minimum interval between components needs to be maintained and, thus, there is a problem in that a wide mounting area is required, electro-magnetic interference (EMI) between components is high, and electrical noise is increased due to a long distance between a semiconductor chip and a passive component.

On the other hand, the fan-out semiconductor package module 100A according to the present embodiment may be modularized by arranging the plurality of passive components 125A and 125B along with the semiconductor chip 120 in a single package. Accordingly, an interval between components may be minimized to minimize a mounting area in a printed circuit board such as a mother board. An electrical path between the semiconductor chip 120 and the passive components 125A and 125B may be minimized, thereby overcoming a problem in terms of noise.

In addition, the fan-out semiconductor package module 100A according to the present embodiment may be formed by performing an encapsulation process via 2-step and, in this case, the first passive components 125A with a relatively low thickness may be first mounted on a surface of the first connection member 110 and, then, the second passive component 125B may be disposed in the second to fifth through-holes 110HB, 110HC, 110HD, and 110HE to encapsulate first passive components 125A, the second passive component 125B, and the second to fifth through-holes 110HB, 110HC, 110HD, and 110HE by the first encapsulation portion 131. The semiconductor chip 120 may be disposed in the first through-hole 110HA to encapsulate the first through-hole 110HA by the second encapsulation portion 132.

Accordingly, an amount of an encapsulation material (e.g., resin) used in the first encapsulation portion 131 for encapsulation of the first passive components 125A and the second passive components 125B may be reduced and it may be possible to control flow of the encapsulation material, thereby overcoming a problem in terms of a mounting error, e.g., the passive components 125A and 125B are detached or deviates from a mounting position.

In addition, the first passive components 125A with a small size may be mounted on the first connection member 110 and, then, may be encapsulated by the first encapsulation portion 131, thereby overcoming a problem in that the first passive components 125A with a small size are twisted or detached due to pressure applied from an encapsulation material during a procedure of injecting the encapsulation material.

Hereinafter, each component included in the fan-out semiconductor package module 100A according to an embodiment is described in more detail.

The first connection member 110 may further improve rigidity of the package module 100A depending on a detailed material and may perform a function of ensuring thickness uniformity of the encapsulation portions 131 and 132, and so on. The first connection member 110 may include the plurality of through-holes 110HA, 110HB, 110HC, 110HD, and 110HE. The plurality of through-holes 110HA, 110HB, 110HC, 110HD, and 110HE may be physically spaced apart from each other. The semiconductor chip 120 and the second passive components 125B may be disposed in the plurality of through-holes 110HA, 110HB, 110HC, 110HD, and 110HE. Each of the semiconductor chip 120 and the second passive components 125B may be spaced apart from a wall surface of the through-holes 110HA, 110HB, 110HC, 110HD, and 110HE by a predetermined interval and may be surrounded by the wall surface of the through-holes 110HA, 110HB, 110HC, 110HD, and 110HE, which may be modified as necessary. A thickness of the first connection member 110 may be smaller than that of the semiconductor chip 120 and, for example, may be equal to or less than 0.5 mm but is not limited thereto.

The first connection member 110 may include an insulating layer 111. A material of the insulating layer 111 is not particularly limited. For example, an insulating material may be used and, in this case, the insulating material may be a thermosetting resin such as an epoxy resin, a thermoplastic resin such as a polyimide resin, a resin in which the thermosetting resin or the thermoplastic resin is mixed with an inorganic filler and is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a photo imageable dielectric (PID) resin may also be used. The first connection member 110 may have higher elastic modulus than the first encapsulation portion 131 to maintain rigidity. For example, the insulating layer 111 of the first connection member 110 may be, for example, prepreg including a glass fiber, an inorganic filler, and insulating resin and the first encapsulation portion 131 may be, for example, ABF including an inorganic filler and insulating resin but the present disclosure is not limited thereto.

As necessary, wiring layers 115 may be formed on each of upper and lower surfaces of the first connection member 110, and a wall surface of the second to fifth through-holes 110HB, 110HC, 110HD, and 110HE. The wiring layers 115 may be disposed on at least one of a wall surface, an upper surface, and a lower surface of the insulating layer 111. An effect for heat dissipation and electromagnetic wave shield may be achieved through the wiring layers 115. A material of the wiring layers 115 may be a conductive material such as copper (Cu), aluminum (Al), silver (Ag), tin (Sn), gold (Au), nickel (Ni), lead (Pb), titanium (Ti), or alloys thereof but is not limited thereto.

The wiring layers 115 may be arranged in the form of circuit wiring and the first passive components 125A that are described below may be electrically connected to the second connection member 140 through the wiring layers 115.

At least one via 113 may be included in the first connection member 110.

The via 113 may electrically connect the wiring layers 115 disposed on the upper and lower surfaces of the first connection member 110, thereby forming an electrical path in the first connection member 110.

The via 113 may be formed of a conductive material and may be formed by completely filling a conductive material in a via hole or may be formed by coating a conductive material on a wall surface of the via hole.

The via 113 according to the present embodiment may be formed in a cylindrical shape but is not limited thereto and, thus, any well-known shape such as a conical shape or a tapered shape may be employed.

The semiconductor chip 120 may be an integrated circuit (IC) in which several hundreds to several millions or more of devices are integrated in one chip. The IC may be, for example, a power management IC (PMIC) but is not limited thereto. The semiconductor chip 120 may be an IC in a bare state in which a separate bump or a redistribution layer is not formed. In this case, the semiconductor chip 120 may physically contact the via 143 of the second connection member 140. The IC may be formed on the basis of an active wafer. In this case, a base material of a body 121 of a semiconductor chip may be silicon (Si), germanium (Ge), gallium arsenide (GaAs), or the like. Various circuits may be formed on the body 121. The connection pads 122 may electrically connect the semiconductor chip 120 to other components and may be formed of a conductive material, for example, aluminum (Al). The passivation layer 123 exposing the connection pads 122 may be formed on the body 121 and the passivation layer 123 may be an oxide layer, a nitride layer, or the like, or may be a double layer of an oxide layer and a nitride layer. An insulating layer (not illustrated), and the like, may also be further disposed in other required positions.

The passive components 125A and 125B may be any one of a multi layer ceramic capacitor (MLCC), a low inductance chip capacitor (LICC), a power inductor, and a bead but is not limited thereto. The passive components 125A and 125B may have different thicknesses. The passive components 125A and 125B may have a different thickness from the semiconductor chip 120. The first passive components 125A with a relatively low height, for example, a thickness of 0.5 mm or less may be mounted on an upper surface of the first connection member 110 and the second passive components 1253 with a relatively high height, for example, a thickness of 0.7 mm or less may be disposed on the second to fifth through-holes 110HB, 110HC, 110HD, and 110HE.

The fan-out semiconductor package module 100A according to the present embodiment may encapsulate the electronic devices 120, 125A, and 125B through an encapsulation process of 2-step or more, thereby minimizing various problems due to the aforementioned thickness deviation. The number of each of the passive components 125A and 125B is not particularly limited and may be larger or smaller than in the drawing.

Each of the first passive components 125A may be electrically connected to the redistribution layer 142 of the second connection member 140 through the via 113 and the wiring layer 115 of the first connection member 110, and may be electrically connected to the connection pads 122 of the semiconductor chip 120 further through the redistribution layer 142.

Each of the second passive components 125B may be electrically connected to the redistribution layer 142 of the redistribution layer 142 or the via 143 of the second connection member 140, and may be electrically connected to the connection pads 122 of the semiconductor chip 120 further through the redistribution layer 142.

The first encapsulation portion 131 may cover and encapsulate at least a portion of each of the first and second passive components 125A and 125B and the first connection member 110. At least a portion of each of the second to fifth through-holes 110HB, 110HC, 110HD, and 110HE may be filled with the first encapsulation portion 131.

The first encapsulation portion 131 may be formed of an encapsulant including an insulating material. The insulating material may be a material including an inorganic filler and an insulating resin, for example, a thermosetting resin such as an epoxy resin, a thermoplastic resin such as polyimide, a resin in which a stiffener including an inorganic filler is mixed therewith and, in detail, may be prepreg, ABF, FR-4, BT, resin, or the like. A well-known molding material such as EMC or the like may also be used. Alternatively, a material of the first encapsulation portion 131 may be formed of a photosensitive insulating material, that is, a photo imagable encapsulant (PIE). Alternatively, a material of the first encapsulation portion 131 may be a material in which an insulating material such as thermosetting resin or thermoplastic resin is mixed with an inorganic filler and/or is impregnated together with an inorganic filler in a core material such as a glass fiber.

A first shield layer 116 may be disposed on a surface formed by the first connection member 110 and the first encapsulation portion 131. The first shield layer 116 may be used to shield an electromagnetic wave and, thus, may be formed of a metal material.

For example, the first shield layer 116 may be formed as a copper layer. However, the present disclosure is not limited thereto and a material of the first shield layer 116 may be a conductive material such as aluminum (Al), silver (Ag), tin (Sn), gold (Au), nickel (Ni), lead (Pb), titanium (Ti), or alloys thereof.

The second encapsulation portion 132 may cover and encapsulate at least a portion of the semiconductor chip 120 and may cover and encapsulate at least a portion of the first encapsulation portion 131 and the first connection member 110. In addition, the second encapsulation portion 132 may be filled in at least a portion of the first through-hole 110HA.

The second encapsulation portion 132 may also be formed of an encapsulant including an insulating material. The insulating material may be a material including an inorganic filler and an insulating resin, for example, a thermosetting resin such as an epoxy resin, a thermoplastic resin such as polyimide, a resin in which a stiffener including an inorganic filler is mixed therewith and, in detail, may be prepreg, ABF, FR-4, BT, resin, or the like. In addition, a material such as EMC or PIE may be used. Alternatively, a material of the second encapsulation portion 132 may be a material in which an insulating resin such as thermosetting resin or thermoplastic resin is mixed with an inorganic filler and/or is impregnated together with an inorganic filler in a core material such as a glass fiber.

The second encapsulation portion 132 may be disposed to cover the first encapsulation portion 131. Accordingly, an upper surface of the second encapsulation portion 132 may be positioned above an upper surface of the first encapsulation portion 131.

A second shield layer 117 may be disposed on a surface of the second encapsulation portion 132.

The second shield layer 117 may be used to shield an electromagnetic wave like the first shield layer 116 and, thus, may use anyone of the materials of the first shield layer 116.

For example, the second shield layer 117 may be formed of the same material as the first shield layer 116 but configurations of the present disclosure are not limited thereto and the second shield layer 117 may be formed of various materials that are capable of shielding an electromagnetic wave.

The first encapsulation portion 131 and the second encapsulation portion 132 may include the same material or different materials. Even if the first encapsulation portion 131 and the second encapsulation portion 132 include the same material, a boundary therebetween may be verified. The first encapsulation portion 131 and the second encapsulation portion 132 may include similar materials but may have different colors. For example, the first encapsulation portion 131 may be more transparent than the second encapsulation portion 132. That is, a boundary therebetween may be clear.

The second connection member 140 may redistribute the connection pads 122 of the semiconductor chip 120. In addition, the second connection member 140 may electrically connect the semiconductor chip 120 and the passive components 125A and 125B.

Several tens to several millions of the connection pads 122 having various functions may be redistributed through the second connection member 140 and may be physically and/or electrically connected to the outside through the electrical connection structures 170 depending on functions.

The second connection member 140 may include an insulating layer 141, the redistribution layer 142 stacked on the insulating layer 141, and the via 143 penetrating through the insulating layer 141 and connecting the redistribution layer 142. The insulating layer 141 and the redistribution layer 142 of the second connection member 140 may be a single layer or may be designed with a larger number of a plurality of layers than in the drawing.

Accordingly, the semiconductor chip 120 may be disposed on a surface of the second connection member 140 and may be electrically connected to the redistribution layer 142. The first connection member 110 may be stacked on a surface of the second connection member 140.

The aforementioned various insulating materials may be selectively used as a material of the insulating layer 141. In addition, a photosensitive insulating material such as PID resin as well as the aforementioned insulating material may be used. For example, the insulating layer 141 may be a photosensitive insulating layer. When the insulating layer 141 has photosensitive properties, the insulating layer 141 may be formed to be thinner and a fine pitch of the via 143 may be more easily achieved. The insulating layer 141 may be a photosensitive insulating layer including insulating resin and an inorganic filler. When the insulating layer 141 has a plurality of layers, the layers may include the same material or, alternatively, may include different materials. When the insulating layer 141 includes a plurality of layers, the layers may be integrated depending on a process and a boundary therebetween may not be clear.

The redistribution layer 142 may substantially redistribute the connection pads 122 and a material of the redistribution layer 142 may be a conductive material such as copper (Cu), aluminum (Al), silver (Ag), tin (Sn), gold (Au), nickel (Ni), lead (Pb), titanium (Ti), or alloys thereof. The redistribution layer 142 may perform various functions depending on designs of corresponding layers. For example, the redistribution layer 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 142 may include a via pad, a connection terminal pad, or the like.

The via 143 may electrically connect the redistribution layer 142, the connection pad 122, the second passive components 125B, and the like, which are formed at different layers. The via 143 may physically contact the connection pads 122 of the semiconductor chip 120 and an electrode pad of the second passive components 125B. In this case, the semiconductor chip 120 may be provided in a bare die form without a bump, a solder ball, or the like and may be connected directly to the via 143 of the second connection member 140. The second passive components 125B may also be provided in an embedded type but not in a SMT type using a solder bump and may be connected directly to the via 143 of the second connection member 140. However, as necessary, the second passive components 125B may be a general type (e.g., SMT type) but not an embedded type (e.g., for build up) and, in this case, may be mounted using a solder bump or the like.

A material of the via 143 may be a conductive material such as copper (Cu), aluminum (Al), silver (Ag), tin (Sn), gold (Au), nickel (Ni), lead (Pb), titanium (Ti), or alloys thereof. The via 143 may be completely filled with a conductive material or the conductive material may also be formed along a wall of each of the vias. The via 143 may have any well-known shape such as a cylindrical shape as well as a tapered shape.

The passivation layer 150 may protect the second connection member 140 from external surroundings. The passivation layer 150 may have an opening for exposing at least a portion of the redistribution layer 142 of the second connection member 140. Several tens to several thousands of such openings may be formed in the passivation layer 150. The passivation layer 150 may include insulating resin and an inorganic filler but may not include a glass fiber. For example, the passivation layer 150 may be ABF but is not limited thereto.

The underbump metal layer 160 may improve connection reliability of the electrical connection structures 170 to improve board level reliability of the package module 100A. The underbump metal layer 160 may be connected to the redistribution layer 142 of the second connection member 140 exposed through the opening of the passivation layer 150. The underbump metal layer 160 may be formed in the opening of the passivation layer 150 by any known metallization method using any known conductive material such as a metal, but is not limited thereto.

The electrical connection structures 170 may be an additional component for physically and/or electrically connecting the semiconductor package module 100A to the outside. For example, the semiconductor package module 100A may be mounted on a main board of an electronic device through the electrical connection structures 170. The electrical connection structures 170 may be formed of a conductive material, for example, a solder. However, this is only an example, and a material of the electrical connection structures 170 is not particularly limited thereto. The electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, interval, arrangement, and the like of the electrical connection structures 170 may not be particularly limited and may be sufficiently changed depending on designs by one of ordinary skill in the art. For example, the number of the electrical connection structures 170 may be several tens to several thousands depending on the number of the connection pad 122 and may be equal to or greater than or equal to or less than several tens to several thousands.

At least one of the electrical connection structures 170 may be disposed in a fan-out region. The fan-out region may refer to a region that deviates from a region in which the semiconductor chip 120 is disposed. A fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Figure 11:
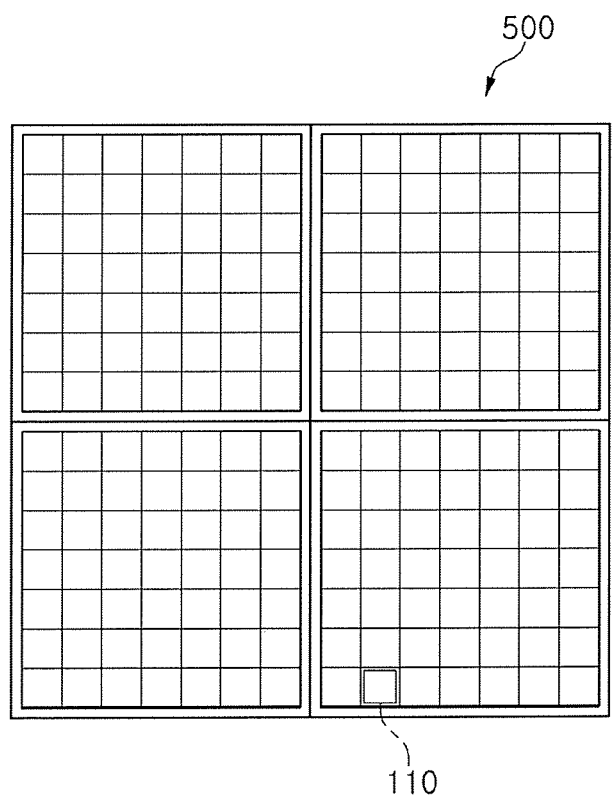
FIG. 11 is a schematic cross-sectional view of an embodiment of a panel used in the fan-out semiconductor package module of FIG. 9.

FIG. 11 is a schematic cross-sectional view of an embodiment of a panel used in the fan-out semiconductor package module of FIG. 9.

Referring to the drawing, the fan-out semiconductor package module 100A according to an embodiment may be manufactured using a large-size panel 500. The size of the panel 500 may be two to four times the size of a general wafer and, thus, a larger number of the fan-out semiconductor package modules 100A may be manufactured through a single process. That is, productivity may be highly enhanced. In particular, as a size of each of the package modules 100A is increased, relative productivity may be enhanced compared with the case in which a wafer is used. Each unit of the panel 500 may be the first connection member 110 that is first prepared in a manufacturing method that is described below. The plurality of fan-out semiconductor package modules 100A may be simultaneously manufactured using the panel 500 through a single process and, then, may be cut using a well-known cutting process, for example, a dicing process to obtain each of the fan-out semiconductor package modules 100A.

FIGS. 12A through 12D are schematic diagrams showing a method of manufacturing the fan-out semiconductor package module illustrated in FIG. 9.

Figure 12A:
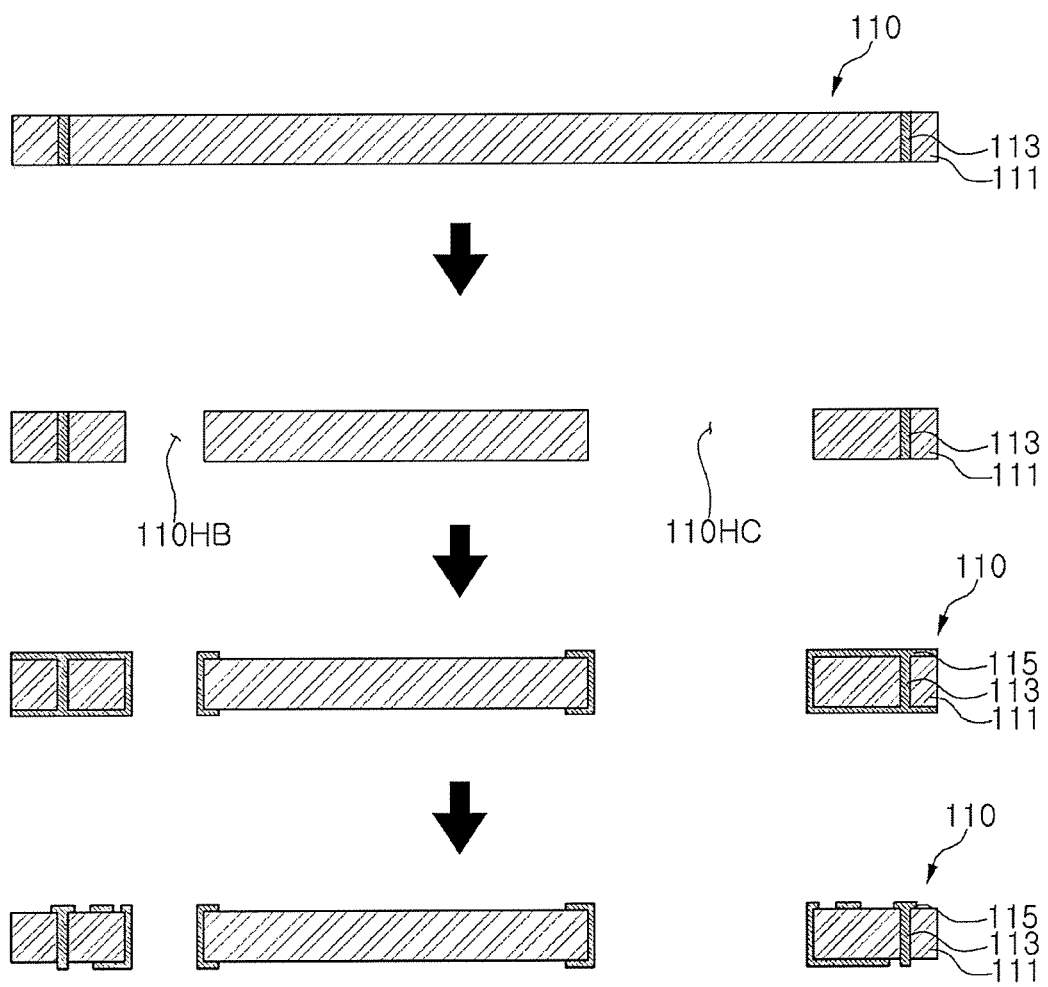
FIGS. 12A through 12D are schematic diagrams showing a method of manufacturing the fan-out semiconductor package module illustrated in FIG. 9.

Referring to FIG. 12A, first, the first connection member 110 may be prepared. The first connection member 110 may introduce a copper clad laminate (CCL) as the aforementioned panel 500.

The first connection member 110 may include at least one via 113. The via 113 may be formed by penetrating through the first connection member 110 to form a via hole and, then, coating or filling a conductive material in the via hole.

Then, the through-holes 110HB, 110HC, 110HD, and 110HE may be formed in the first connection member 110. FIG. 12A is a cross-sectional view and illustrates only the second and third through-holes 110HB and 110HC but the fourth and fifth through-holes 110HD and 100HE may also be formed. Each of the through-holes 110HB, 110HC, 110HD, and 110HE may be formed using a laser drill and/or a mechanical drill depending on a material of the insulating layer 111. Depending on the cases, sand blast or a chemical method may be used.

Then, the wiring layer 115 may be formed on a surface of the first connection member 110.

First, a plating process may be performed using a copper foil of a copper clad laminate as a seed layer to form a metal layer. During this process, the metal layer may be connected to the via 113.

Then, the metal layer formed on the surface of the first connection member 110 may be patterned to complete the wiring layer 115. The wiring layer 115 may be formed via photolithography but is not limited thereto.

Figure 12B:
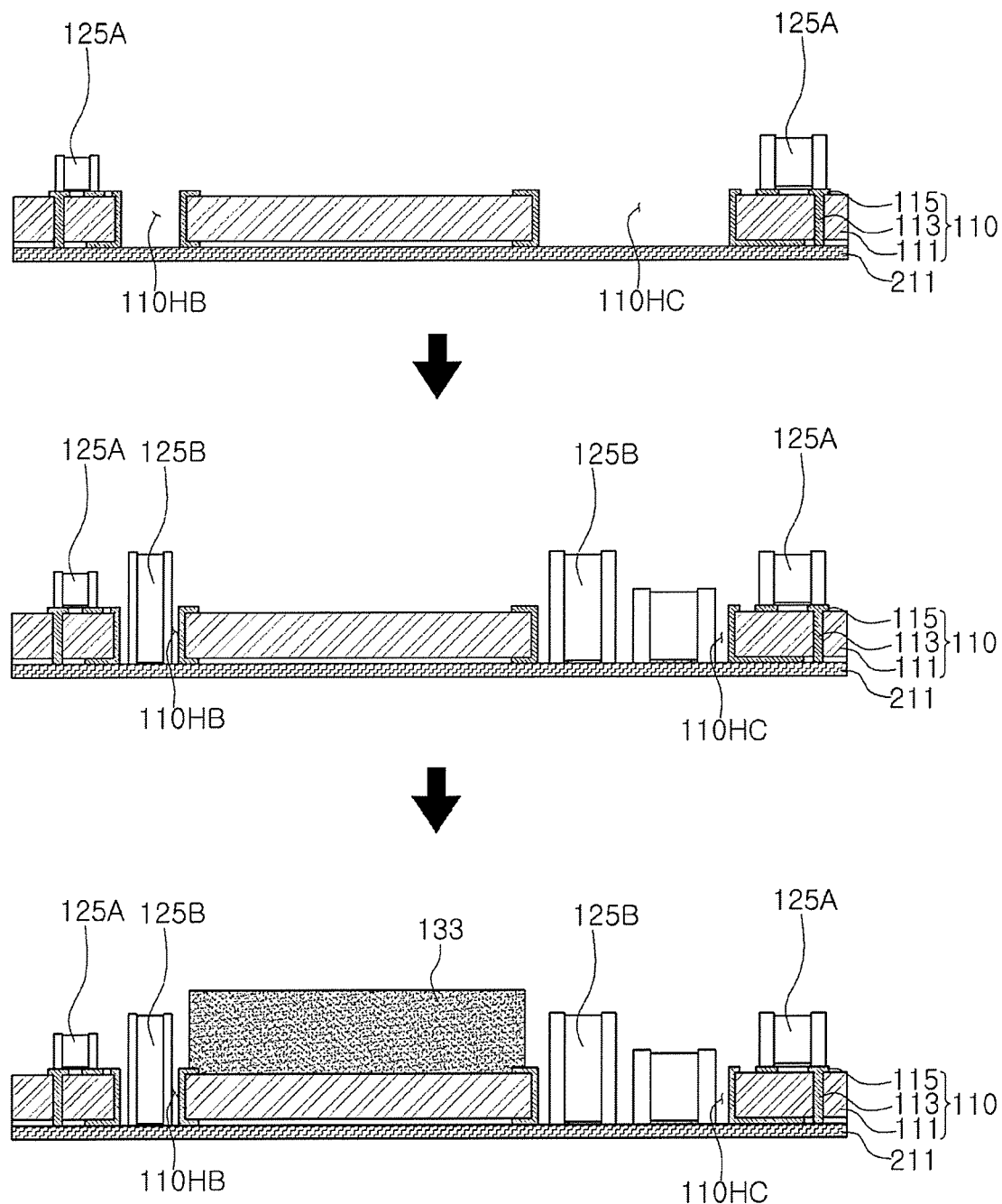

Then, referring to FIG. 12B, the first passive components 125A may be mounted on the wiring layer 115 formed on the surface of the first connection member 110. The first passive components 125A mounted on the first connection member 110 may include components with a thickness equal to or less than 0.5 mm. In the present operation, the first passive components 125A may be adhered to the wiring layer 115 using conductive adhesives as a medium. For example, the first passive components 125A may be mounted on the wiring layer 115 via soldering. Accordingly, the first passive components 125A may include general components (e.g., SMT components) but not embedding components.

Then, a first adhesive film 211 may be attached to a lower surface of the first connection member 110 and the second passive components 125B may be arranged in the through-holes 110HB, 110HC, 110HD, and 110HE, respectively. The first adhesive film 211 may be a well-known tape but is not limited thereto.

Then, an insulating member 133 may be stacked on the first connection member 110.

When the insulating member 133 is omitted, the second passive components 125B with a large height difference from the first connection member 110 may fall or deviate from a mounting position due to pressure that is applied while an encapsulation material is supplied during an encapsulation process that is described below.

Accordingly, to overcome the above problem, according to the present embodiment, the insulating member 133 may be stacked on an upper surface of the first connection member 110, in which the through-holes 110HB, 110HC, 110HD, and 110HE are not formed. The insulating member 133 may be completely embedded in the first encapsulation portion 131 that is described below. In this case, the insulating member 133 may be formed to have a smaller thickness than that of the first encapsulation portion 131.

The insulating member 133 may be formed of the same material as the first encapsulation portion 131. In this case, in the completed package module 100A, the insulating member 133 and the first encapsulation portion 131 may not be clearly distinguished. However, the present disclosure is not limited thereto and, as necessary, the insulating member 133 may be formed of a different material from the first encapsulation portion 131.

Figure 12C:
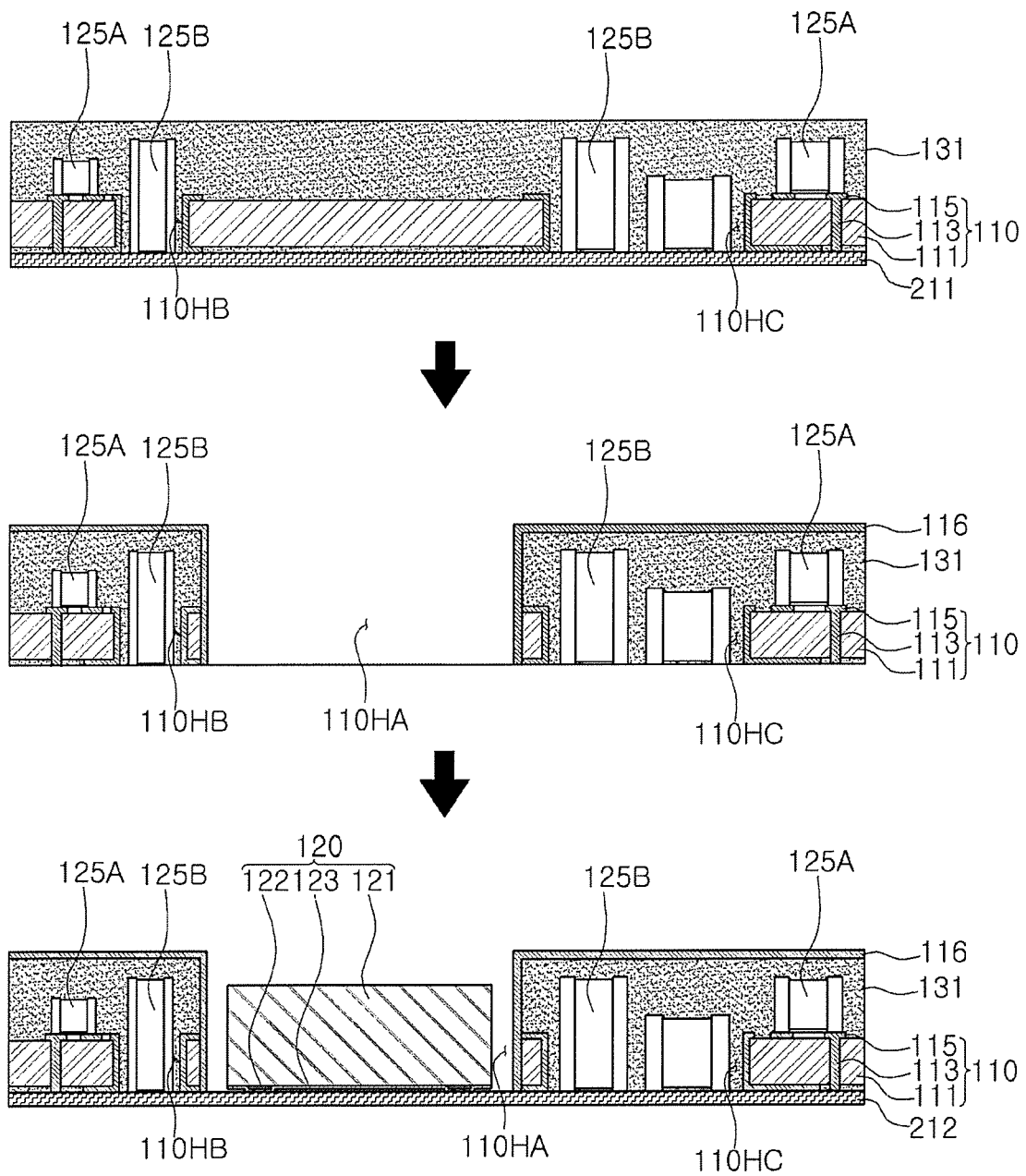

Then, referring to FIG. 12C, the first connection member 110 and the passive components 125A and 125B may be encapsulated using the first encapsulation portion 131. The first encapsulation portion 131 may be formed using a method of laminating a non-hardened film and then hardening the film or a method of coating a liquid material and then hardening the material. During this process, the first encapsulation portion 131 may completely embed the insulating member 133.

Then, the first adhesive film 211 may be removed. The first adhesive film 211 may be removed using a mechanical method. Then, the first through-hole 110HA penetrating through the first encapsulation portion 131 and the first connection member 110 may be formed. The first through-hole 110HA may be formed using a laser drill and/or a mechanical drill depending on a material of the first connection member 110 or the insulating layer 111. Depending on the cases, sand blast or a chemical method may be used.

When the first through-hole 110HA is formed, the first shield layer 116 may be formed on a surface of the first connection member 110 and the first encapsulation portion 131. The first shield layer 116 may be used to shield an electromagnetic wave. Accordingly, the first shield layer 116 may be formed of a metal material and may be formed as, for example, a copper layer. However, the present disclosure is not limited thereto and a material of the first shield layer 116 may be a conductive material such as aluminum (Al), silver (Ag), tin (Sn), gold (Au), nickel (Ni), lead (Pb), titanium (Ti), or alloys thereof.

The first shield layer 116 may be formed on an entire surface formed by the first encapsulation portion 131 and the first connection member 110. Accordingly, the first shield layer 116 may also be formed on an internal wall surface of the first through-hole 110HA.

Then, a second adhesive film 212 may be attached to a lower surface of the first connection member 110 and the semiconductor chip 120 may be disposed in the first through-hole 110HA. The semiconductor chip 120 may be disposed in a face-down form. The second adhesive film 212 may also be a well-known tape but is not limited thereto.

Figure 12D:
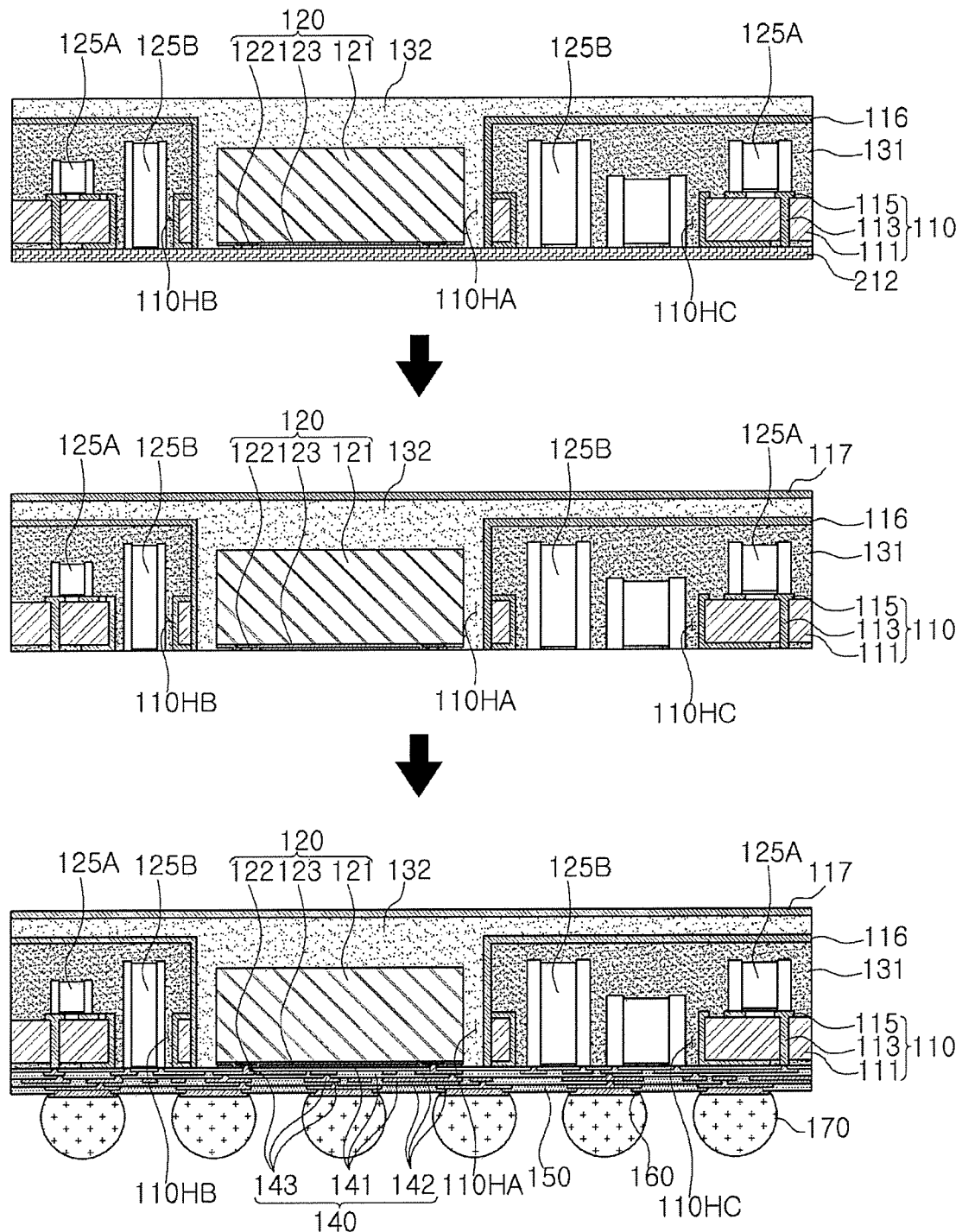

Then, referring to FIG. 12D, an internal portion of the first through-hole 110HA may be filled using the second encapsulation portion 132 and at least a portion of the semiconductor chip 120 and the first encapsulation portion 131 may be encapsulated. During this process, the first connection member 110 exposed through the first through-hole 110HA (substantially, the first shield layer 116 is formed on the exposed surface) may also be encapsulated therewith.

The second encapsulation portion 132 may also be disposed on the first encapsulation portion 131 to entirely encapsulate the first encapsulation portion 131.

The second encapsulation portion 132 may also be formed using a method of laminating a non-hardened film and then hardening the film or a method of coating a liquid material and then hardening the material.

Then, the second shield layer 117 may be formed on a surface of the second encapsulation portion 132. The second shield layer 117 may be used to shield an electromagnetic wave like the first shield layer 116. Accordingly, the second shield layer 117 may use any one of the materials of the first shield layer 116 and may be formed of the same material as the first shield layer 116. However, the present disclosure is not limited thereto and the second shield layer 117 may use various materials that are capable of shielding an electromagnetic wave.

Then, the second adhesive film 212 may be removed and the second connection member 140 may be formed in a lower region from which the second adhesive film 212 is removed. The second connection member 140 may be formed by forming the insulating layer 141 using a well-known lamination method or coating method, forming a hole for the via 143 using a photolithography method or a laser drill and/or a mechanical drill and, then, forming the redistribution layer 142 and the via 143 using a well-known plating method such as electroplating or electro less plating. Then, the passivation layer 150 may be formed using a well-known lamination method or coating method, the underbump metal layer 160 may be formed using a well-known metallization method, and the electrical connection structures 170 may be formed using a well-known method.

When the panel 500 of FIG. 11 or the like is used, the plurality of fan-out semiconductor package modules 100A may be manufactured using a single process through a series of processes. Then, each of the fan-out semiconductor package modules 100A may be obtained through a dicing process or the like.

Figure 13:
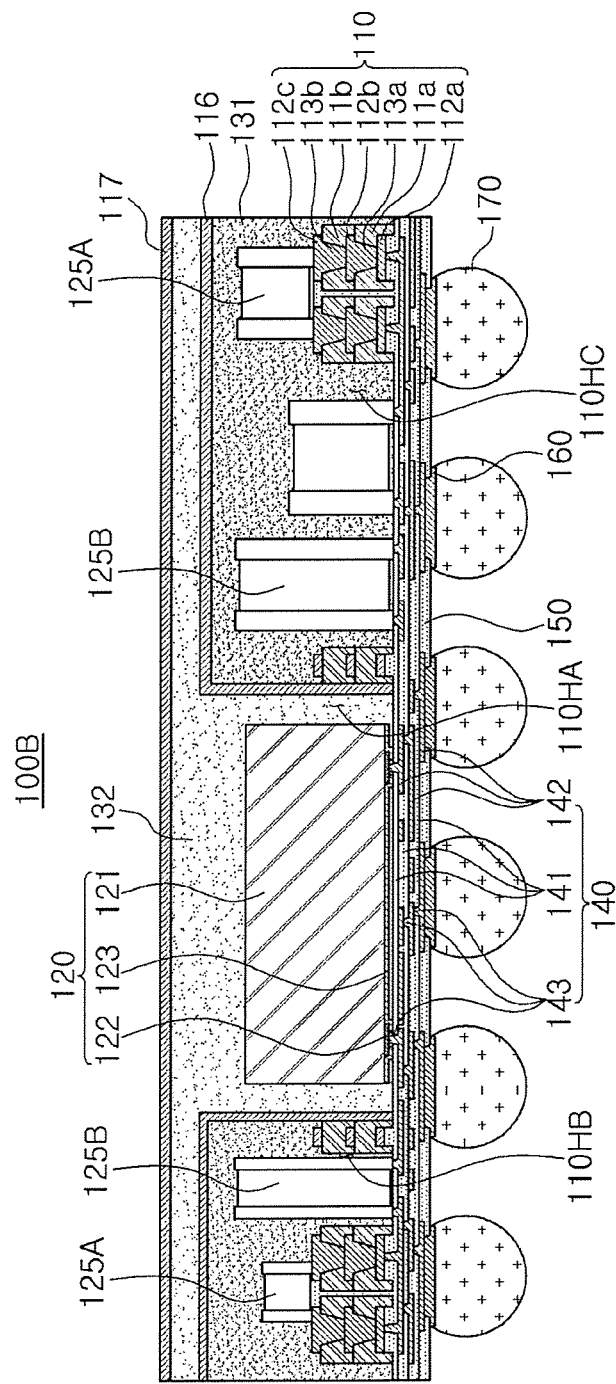
FIG. 13 is a schematic cross-sectional view of a fan-out semiconductor package module according to another embodiment.

FIG. 13 is a schematic cross-sectional view of a fan-out semiconductor package module according to another embodiment.

Referring to the drawing, in a fan-out semiconductor package module 100B according to present embodiment, the first connection member 110 may include a first insulating layer 111a that contacts the second connection member 140, a first wiring layer 112a that contacts the second connection member 140 and is embedded in the first insulating layer 111a, a second wiring layer 112b disposed on an opposite side to a side of the first insulating layer 111a, in which the first wiring layer 112a is embedded, a second insulating layer 111b disposed on the first insulating layer 111a and covering the second wiring layer 112b, and a third wiring layer 112c disposed on the second insulating layer 111b, in addition to the fan-out semiconductor package module 100A according to the aforementioned embodiment. The first to third wiring layers 112a, 112b, and 112c may be electrically connected to the connection pads 122. The first and second wiring layers 112a and 112b and the second and third wiring layers 112b and 112c may be electrically connected to each other through first and second vias 113a and 113b penetrating through the first and second insulating layers 111a and 111b, respectively.

A thickness of the wiring layers 112a, 112b, and 112c of the first connection member 110 may be greater than a thickness of the redistribution layer 142 of the second connection member 140. The first connection member 110 may be manufactured through a substrate process and, thus, the wiring layers 112a, 112b, and 112c may also be formed with a relatively large size depending on a scale thereof. On the other hand, the second connection member 140 may be manufactured using a semiconductor process and may be formed with a smaller size than the wiring layers 112a, 112b, and 112c for thinning.

A material of the insulating layers 111a and 111b is not particularly limited. For example, an insulating material may be used. In this case, the insulating material may be a thermosetting resin such as an epoxy resin, a thermoplastic resin such as a polyimide resin, a resin in which the thermosetting resin or the thermoplastic resin is mixed with an inorganic filler and is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. Alternatively, a photo imageable dielectric (PID) resin may also be used.

The wiring layers 112a, 112b, and 112c may be electrically connected to the connection pad 122 of the semiconductor chip 120. In addition, the wiring layers 112a, 112b, and 112c may also be electrically connected to the passive components 125A and 125B. A material of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include a via pad, a wire pad, a connection terminal pad, or the like.

The vias 113a and 113b may electrically connect the wiring layers 112a, 112b, and 112c formed at different layers and, accordingly, an electrical path may be formed in the first connection member 110. A material of the vias 113a and 113b may also be a conductive material. The vias 113a and 113b may be completely filled with a conductive material or the conductive material may also be formed along a wall surface of each of via holes. The vias 113a and 113b may have any well-known shape such as a cylindrical shape as well as a tapered shape. When a hole for the first via 113a is formed, some pads of the first wiring layer 112a may function as a stopper and, thus, it is advantageous when the first via 113a has a tapered shape in which a width of an upper surface is greater than a lower surface in terms of a process. In this case, the first via 113a may be integrated with a pad pattern of the second wiring layer 112b. When a hole for the second via 113b is formed, some pads of the second wiring layer 112b may function as a stopper and, thus, it is advantageous when the second via 113b has a tapered shape in which a width of an upper surface is greater than a lower surface in terms of a process. In this case, the second via 113b may be integrated with a pad pattern of the third wiring layer 112c.

Figure 14:
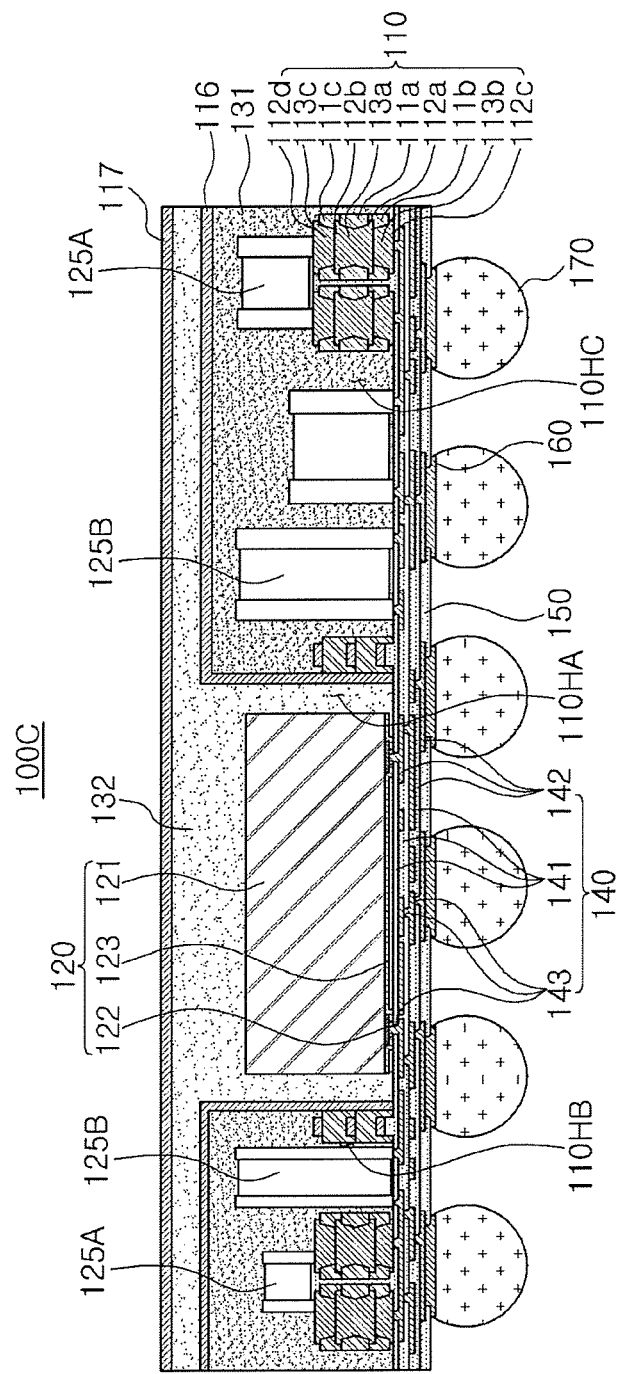
FIG. 14 is a schematic cross-sectional view of a fan-out semiconductor package module according to another embodiment.

FIG. 14 is a schematic cross-sectional view of a fan-out semiconductor package module according to another embodiment.

Referring to the drawing, in a fan-out semiconductor package module 100C according to another embodiment, the first connection member 110 may include the first insulating layer 111a, the first wiring layer 112a and the second wiring layer 112b that are disposed on opposite surfaces of the first insulating layer 111a, the second insulating layer 111b disposed on the first insulating layer 111a and covering the first wiring layer 112a, the third wiring layer 112c disposed on the second insulating layer 111b, a third insulating layer 111c disposed on the first insulating layer 111a and covering the second wiring layer 112b, and a fourth wiring layer 112d disposed on the third insulating layer 111c, in addition to the fan-out semiconductor package module 100A according to the aforementioned embodiment. The first to fourth wiring layers 112a, 112b, 112c, and 112d may be electrically connected to the connection pad 122. The first connection member 110 may include a larger number of the wiring layers 112a, 112b, 112c, and 112d and, thus, the second connection member 140 may be more simplified. Accordingly, degradation in a yield due to an error during formation of the second connection member 140 may be prevented. The first to fourth wiring layers 112a, 112b, 112c, and 112d may be electrically connected through the first to third vias 113a, 113b, and 113c penetrating through the first to third insulating layers 111a, 111b, and 111c, respectively.

The first insulating layer 111a may have a higher thickness than that of the second insulating layer 111b and the third insulating layer 111c. The first insulating layer 111a may have a relatively great thickness to basically maintain rigidity and the second insulating layer 111b and the third insulating layer 111c may be introduced to form a larger number of the wiring layers 112c and 112d. The first insulating layer 111a may include a different insulating material from the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF film or a PID film including a filler and an insulating resin but the present disclosure is not limited thereto. Similarly, the first via 113a penetrating through the first insulating layer 111a may have a greater diameter than the second and third vias 113*b* and 113*c* penetrating through the second and third insulating layers 111*b* and 111*c*.

A thickness of the wiring layers 112*a*, 112*b*, 112*c*, and 112*d* of the first connection member 110 may be greater than a thickness of the redistribution layer 142 of the second connection member 140. The wiring layers 112*a*, 112*b*, 112*c*, and 112*d* of the first connection member 110 may be electrically connected to the connection pad 122 and the passive components 125A and 125B.

Figure 15:
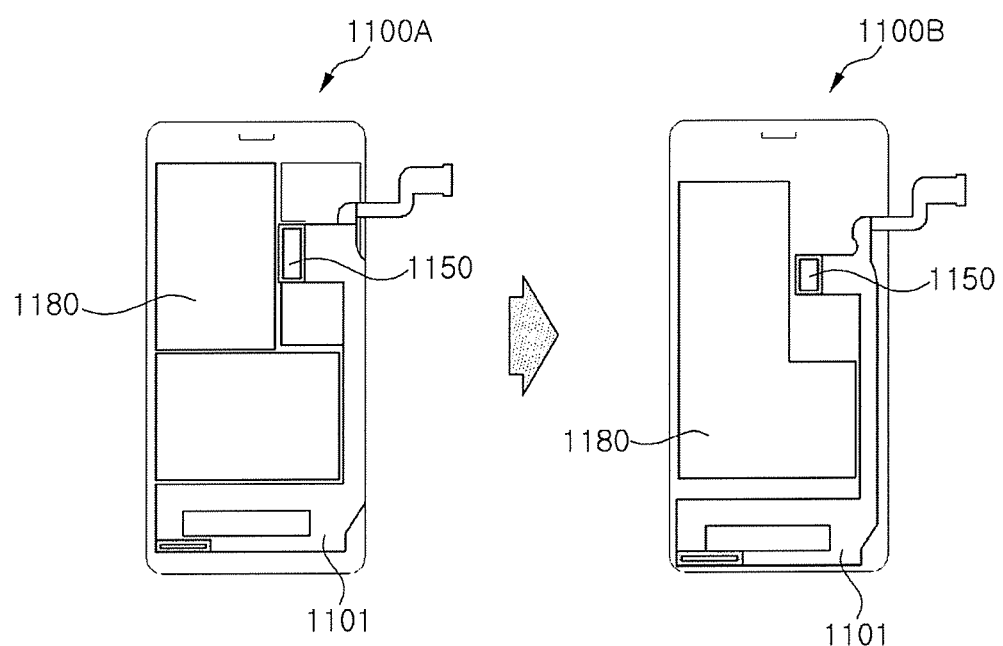
FIG. 15 is a diagram for explanation of an effect when a fan-out semiconductor package module is applied to an electronic device according to the present disclosure.

FIG. 15 is a diagram for explanation of an effect when a fan-out semiconductor package module is applied to an electronic device according to the present disclosure.

Referring to the drawing, recently, along with development of a display for mobiles 1100A and 1100B, there has been an increasing need for increase in battery capacity. Since an area occupied by a battery 1180 is increased due to increase in battery capacity, to this end, there is a need to reduce a size of a mother board 1101 to reduce a mounting area of a component and, accordingly, an area occupied by a module 1150 including PMIC and passive components based thereon has been continuously reduced. In this case, when the fan-out semiconductor package modules 100A, 100B, and 100C according to the present disclosure is applied, it may be possible to minimize a size of the module 1150 and, thus, such a narrowed area may be effectively used.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiment in the present disclosure, a mounting area of a semiconductor chip and a plurality of passive components may be minimized and a problem in terms of a yield may be overcome while an electrical path between the semiconductor chip and the passive components is minimized. In addition, a problem in that small-sized passive components are detached or deviate due to pressure applied by an encapsulant during formation of the encapsulant may be overcome.

While exemplary embodiments have been shown and described above, it will be apparent to those skilled in the art that modifications and variations could be made without departing from the scope of the present disclosure as defined by the appended claims.

What is claimed is:

1. A fan-out semiconductor package module comprising:
a first connection member including a wiring layer;
a first passive component mounted on the first connection member;
a first encapsulation portion encapsulating at least a portion of the first connection member and the first passive component;
a semiconductor chip having an active surface with a connection pad disposed thereon and an inactive surface opposing the active surface, and disposed in a first through-hole penetrating through the first connection member and the first encapsulation portion;
a second encapsulation portion covering at least a portion of the semiconductor chip and encapsulating at least a portion of the first encapsulation portion and the first connection member; and
a second connection member disposed on the first connection member and the active surface of the semiconductor chip and including a redistribution layer electrically connected to the connection pad and the first passive component.

2. The fan-out semiconductor package module of claim 1, wherein the first connection member further includes a second through-hole spaced apart from the first through-hole; and
the fan-out semiconductor package module further comprises a second passive component disposed in the second through-hole.

3. The fan-out semiconductor package module of claim 2, wherein the first passive component has a thickness less than a thickness of the second passive component.

4. The fan-out semiconductor package module of claim 2, wherein the semiconductor chip includes a power management integrated circuit (PMIC); and
wherein each of the first and second passive components includes a capacitor.

5. The fan-out semiconductor package module of claim 1, wherein the semiconductor chip has a thickness greater than a thickness of the first connection member.

6. The fan-out semiconductor package module of claim 1, wherein the first connection member further includes a via electrically connecting the first passive component and the redistribution layer of the second connection member.

7. The fan-out semiconductor package module of claim 1, further comprising a first shield layer disposed on the first encapsulation portion and the first connection member.

8. The fan-out semiconductor package module of claim 1, further comprising a second shield layer disposed on the second encapsulation portion.

9. The fan-out semiconductor package module of claim 1, wherein an upper surface of the second encapsulation portion is positioned above an upper surface of the first encapsulation portion.

10. The fan-out semiconductor package module of claim 1, wherein the first passive component is adhered to the first connection member using conductive adhesives.

11. The fan-out semiconductor package module of claim 1, wherein the semiconductor chip includes a power management integrated circuit (PMIC); and
wherein the first passive component includes a capacitor.

12. The fan-out semiconductor package module of claim 1, wherein the first connection member includes a first insulating layer contacting the second connection member, a first wiring layer contacting the second connection member and embedded in the first insulating layer, and a second wiring layer disposed on an opposite side to a side of the first insulating layer, in which the first wiring layer is embedded; and
wherein the first and second wiring layers are electrically connected to the connection pad.

13. The fan-out semiconductor package module of claim 12, wherein the first connection member further includes a second insulating layer disposed on the first insulating layer and covering the second wiring layer, and a third wiring layer disposed on the second insulating layer; and
wherein the third wiring layer is electrically connected to the connection pad.

14. The fan-out semiconductor package module of claim 1, wherein the first connection member includes a first insulating layer and a first wiring layer and a second wiring layer that are disposed on opposite surfaces of the first insulating layer, and
wherein the first and second wiring layers are electrically connected to the connection pad.

15. The fan-out semiconductor package module of claim 14, wherein the first connection member further includes a second insulating layer disposed on the first insulating layer and covering the first wiring layer, a third wiring layer disposed on the second insulating layer, a third insulating layer disposed on the first insulating layer and covering the second wiring layer, and a fourth wiring layer disposed on the third insulating layer; and
wherein the third and fourth wiring layers are electrically connected to the connection pad.

16. The fan-out semiconductor package module of claim 1, further comprising a third passive component,
wherein one terminal of the first passive component and one terminal of the third passive component are connected to each other by a wiring disposed on a surface of the first connection member, on which the first and third passive components are mounted.

17. A fan-out semiconductor package module comprising:
a second connection member including a redistribution layer;
a semiconductor chip disposed on a surface of the second connection member and electrically connected to the redistribution layer;
a first connection member stacked on the surface of the second connection member;
a passive component mounted on a surface of the first connection member;
a first encapsulating layer encapsulating at least a portion of the first connection member and the passive components; and
a second encapsulating layer covering at least a portion of the semiconductor chip and encapsulating at least a portion of the encapsulating layer.

18. The fan-out semiconductor package module of claim 17, wherein the passive component is electrically connected to the redistribution layer by a via penetrating through the first connection member.

19. The fan-out semiconductor package module of claim 17, further comprising a shield layer separating the first encapsulating layer and the second encapsulating layer.

* * * * *